United States Patent
Kweon et al.

(10) Patent No.: US 6,452,282 B1
(45) Date of Patent: Sep. 17, 2002

(54) INSULATING ADHESIVE TAPE FOR A SEMICONDUCTOR CHIP PACKAGE HAVING A COPPER LEAD FRAME

(75) Inventors: Jeong Min Kweon, Kyunggi-do; Soon Sik Kim, Seoul; Kyeong Ho Chang, Seoul; Kyung Rok Lee, Seoul, all of (KR)

(73) Assignee: Saehan Micronics Incorporation, Kyunggi-do (KR)

( * ) Notice: Subject to any disclaimer, the term of this patent is extended or adjusted under 35 U.S.C. 154(b) by 0 days.

(21) Appl. No.: 09/858,445

(22) Filed: May 17, 2001

(51) Int. Cl.[7] .................................................. H01L 23/48

(52) U.S. Cl. ........................ 257/783; 257/676; 257/701; 257/705

(58) Field of Search ................................ 257/678, 701, 257/705, 706, 783, 676; 528/353

(56) References Cited

U.S. PATENT DOCUMENTS

| | | | | |
|---|---|---|---|---|
| 5,583,375 A | * | 12/1996 | Tsubosaki et al. | 257/692 |
| 6,031,068 A | * | 2/2000 | Okada | 528/353 |
| 6,045,886 A | * | 4/2000 | Oka et al. | 428/41.5 |
| 6,265,782 B1 | * | 7/2001 | Yamamoto et al. | 257/783 |

FOREIGN PATENT DOCUMENTS

JP        2000052480    *  2/2000

* cited by examiner

*Primary Examiner*—Hoai Ho
*Assistant Examiner*—Tu-Tu Ho
(74) *Attorney, Agent, or Firm*—Harrison & Egbert

(57) ABSTRACT

An insulating tape for use in LOC (lead-on-chip) type semiconductor chip packages. With a tripartite structure in which two adhesive layers are provided to both surfaces of a base film, the insulating tape ranges, in coefficient of thermal expansion, from 16.0 to 23.5 ppm/° C. and is very useful in improving the reliability of LOC semiconductor chip packages having lead frames.

4 Claims, 1 Drawing Sheet ed for a coefficient of thermal expansion according to ASTM D 696–91.

INSULATING ADHESIVE TAPE FOR A SEMICONDUCTOR CHIP PACKAGE HAVING A COPPER LEAD FRAME

BACKGROUND OF THE INVENTION

1. Field of the Invention

The present invention relates, in general, to an insulating adhesive tape for semiconductor chip packages and, more particularly, to an insulating adhesive tape with a coefficient of thermal expansion suitably designed to improve the reliability of lead-on-chip (LOC) type semiconductor chip packages based on copper lead frames.

2. Description of Related Art

As described in U.S. Pat. No. 4,943,843, LOC type semiconductor chip packages were suggested for packaging semiconductor chips at high densities. With reference to FIG. 1, there is a structure of a typical LOC type semiconductor chip package. Generally, in such a conventional LOC type semiconductor chip package structure, an insulating tape 1 is applied between a lead frame 2 and semiconductor chip 3 to bond them to each other. Another insulating tape known in the art has a tripartite structure consisting of a polyimide base film on either side of which a thermoplastic and a thermosetting adhesive layer is formed. U.S. Pat. No. 5,583,375 discloses a tripartite insulating tape comprising a base film 25 to 125 $\mu$m thick with the adhesive layer ranging, in thickness, from 10 to 30 $\mu$m.

Conventionally, LOC packages adopting nickel-based lead frames have been extensively used. However, copper lead frames are recently preferred because of high-speed signal transmission and thermal radiation of packages. When the insulating tape which has a base film with a thickness of 25–125 $\mu$m and adhesive layers with a thickness of 10–30 $\mu$m is used, semiconductor chips packaged on lead frames show good reliable results. In contrast to nickel lead frames, the semiconductor chip packages adopting copper lead frames do not ensure reliability in the operation of the chips when the insulating tape suggested in U.S. Pat. No. 5,583,375 is used.

BRIEF SUMMARY OF THE INVENTION

Leading to the present invention, the intensive and thorough research on insulating tapes for use in semiconductor chip packages, conducted by the inventors, resulted in the finding that the coefficient of thermal expansion of an insulating tape plays an important role in determining the performance of the semiconductor chip packages adopting copper lead frames.

Therefore, it is an object of the present invention to overcome the above problems encountered in the prior art and to provide an insulating tape with such a suitable coefficient of thermal expansion to improve the reliability of LOC type semiconductor chip packages adopting copper lead frames.

Based on the present invention, the above object could be accomplished by a provision of an insulating tape for use in lead-on-chip type semiconductor chip packages having copper lead frames, which comprises a base film on either of which an adhesive layer is formed, and ranges in coefficient of thermal expansion from 16.0 to 23.5 ppm/° C.

DETAILED DESCRIPTION OF THE PRESENT INVENTION

LOC semiconductor chip packages which adopt copper lead frames are not consistent in reliability when using conventional insulating tapes which were developed to be suited to LOC semiconductor packages adopting nickel lead frames. Under various assumptions, a large number of experiments were performed, finally leading the present inventors to the conclusion that, when being designed to have a coefficient of thermal expansion similar to that of the copper lead frame, the insulating tape can bring about a great improvement in the reliability of the semiconductor chips.

The term "copper lead frame" or "copper-based lead frame" as used herein means a lead frame comprising 98.5% or more of copper.

Figure 1:
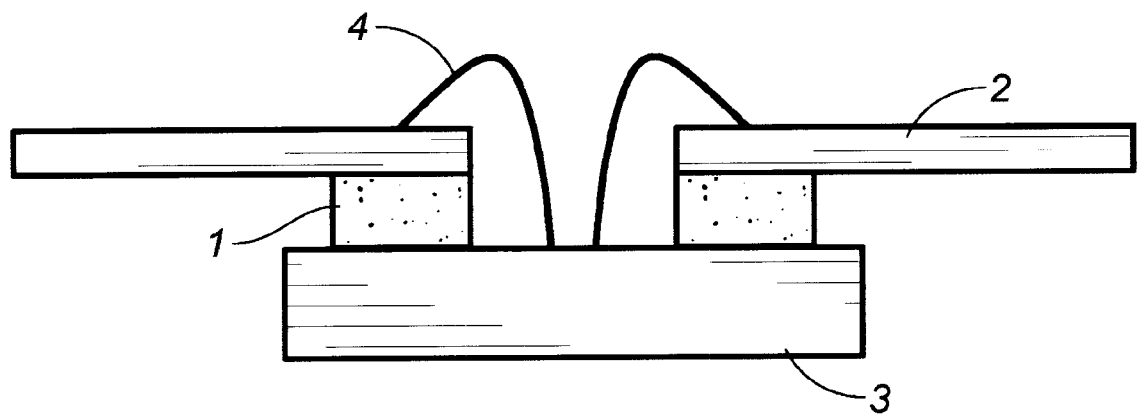
FIG. 1 is a schematic diagrammatic illustration of a structure of a general LOC type semiconductor chip package.
Figure 2:
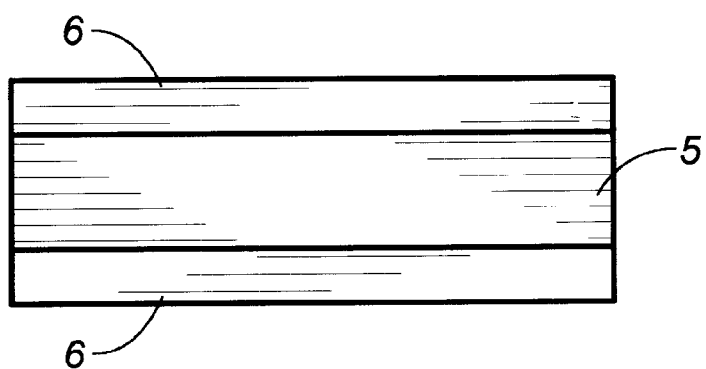
FIG. 2 is a cross-sectional view showing a tripartite structure of the insulating tape of the present invention.

With reference to FIG. 2, there is shown a tripartite structure of the insulating tape of the present invention. As seen in the cross sectional view of FIG. 2, the insulating tape comprises a base film 5 on both surfaces of which two adhesive layers 6 are formed.

Useful as a base film in the present invention is a heat-resistant film, examples of which include heat-resistant resin films, such as polyimide, polyphenylene sulfide, polyether, polyparavanic acid, polyethylene terephthalate, fluorine-based resins, etc., and composite heat-resistant films, such as epoxy resin-polyimide, inorganic particle-added polyimide, etc., with preference for polyimide film. This film is commercially available from DuPont and Kaneka as Kapton, and from Ube as Upilex. A preferable thickness of the base film falls within the range of 10 to 50 $\mu$m. However, the thickness of the base film is not limitative of the present invention and may vary depending on the coefficient of thermal expansion of the final tripartite structure (adhesive/base film/adhesive) of the insulating tape. As for the coefficient of thermal expansion of the base film, it preferably ranges from 5 to 22 ppm/° C., but does not limit the scope of the present invention.

Thermosetting or thermoplastic adhesive layers with a coefficient of thermal expansion of 20 to 300 ppm/° C. are useful in the present invention. Particularly, a polyimide based or polyamide-imide based adhesive is preferably used.

Depending on the structure of the final tripartite insulating tape, the coefficient of thermal expansion and thickness of each layer thereof are determined.

A significant improvement was found in the reliability of an LOC-type semiconductor chip package using a copper lead frame when a tripartite insulating tape designed to have an overall coefficient of thermal expansion in the range of 16.0–23.5 ppm/° C.

A better understanding of the present invention may be obtained in light of the following examples which are set forth to illustrate, but are not to be construed to limit the present invention. In the following examples, insulating tapes and semiconductor package chips were evaluated for coefficient of thermal expansion and reliability, respectively, as follows.

1. Test for Coefficient of Thermal Expansion (ASTM D 696–91)

An elongated, insulating tape was cut into a shape with a width of 50 mm and a length of 150–300 mm. This insulating tape piece was rolled into a cylindrical sample which was 14 mm in diameter and 50 mm in length and measured for its length at −30° C. and 30° C., followed by dividing the change in length by the original length to calculate its coefficient of thermal expansion, which was defined as a length change rate per temperature.

2. Test for Reliability (Military Standard 883 C Test Method 1010)

The level C method was used as a reliability test method of semiconductor package chips. Semiconductor package chips were subjected to thermal damage with thermal cycles, each consisting of maintenance of −65° C. over 10 min, temperature elevation to 150° C. for 10 min, maintenance of 150° C. for 10 min, and temperature decrease to −65° C. over 10 min. After performing 300, 600 and 1,000 thermal cycles, the chips were tested for reliability in terms of the frequency of heel cracking and heel opening.

EXAMPLE 1

To a reactor equipped with a stirrer, a reflux condenser, and a nitrogen inlet, 1,3-bis(3-aminophenoxy) benzene 5.84 g (0.02 moles) and paraphenylene diamine 1.08 g (0.01 mole) were added, followed by adding N-methyl-2-pyrrolidone (NMP) 173.07 g as a solvent and dissolving the diamines at 15° C. The resulting solution was combined with 3,3',4,4'-benzophenonetetracarboxylic dianhydride 9.67 g (0.03 moles) and reacted for 5 hours in a nitrogen atmosphere with vigorous stirring, so as to produce polyamide acid.

To the obtained polyamide acid were added toluene 50 ml and p-toluenesulfonic acid 3.0 g, followed by imidization at 190° C. for 6 hours while separating water, an azeotrope with toluene, formed during the reaction. Afterwards, the resulting polyimide solution was added to methanol to produce precipitates that were then separated, pulverized, washed and dried to afford a powder. This powder was identified as polyimide as measured for IR absorbance at 1718 $cm^{-1}$ and 1783 $cm^{-1}$, which are typical absorbance peaks for the imide group.

Using a knife coater, the polyimide was applied to one surface of Upilex-S 25 μm polyimide film at such a thickness as for the adhesive layer to be finally 12.5 μm upon being dried at 120–230° C. for 30 min. The other surface was also provided with the same polyimide layer of the same thickness to give a tripartite insulating tape 50 μm thick with a coefficient of thermal expansion of 16.0 ppm/° C.

EXAMPLE 2

To a reactor equipped with a stirrer, a reflux condenser, and a nitrogen inlet, 1,3-bis(3-aminophenoxy) benzene 5.84 g (0.02 moles) and paraphenylene diamine 1.08 g (0.01 mole) were added, followed by adding N-methyl-2-pyrrolidone (NMP) 173.07 g as a solvent and dissolving the diamines at 15° C. The resulting solution combined added with 3,3',4,4'-benzophenonetetracarboxylic dianhydride 9.31 g (0.03 moles) and reacted for 5 hours in a nitrogen atmosphere with vigorous stirring, so as to synthesize polyamide acid.

To the produced polyamide acid were added toluene 50 ml and p-toluenesulfonic acid 3.0 g, followed by imidization at 190° C. for 6 hours while separating water, an azeotrope with toluene, formed during the reaction. Afterwards, the resulting polyimide solution was added to methanol to produce precipitates that were then separated, pulverized, washed and dried to afford a powder. This powder was identified as polyimide as measured for IR absorbance at 1718 $cm^{-1}$ and 1783 $cm^{-1}$, which are typically produced by the imide group.

Using a knife coater, the polyimide was applied to one surface of Upilex-S 25 μm polyimide film at such a thickness as for the adhesive layer to be finally 15 μm upon being dried at 120–230° C. for 30 min. The other surface was also provided with the polyimide layer of the same thickness to give a tripartite insulating tape 55 μm thick with a coefficient of thermal expansion of 17.6 ppm/° C.

EXAMPLE 3

The same procedure as in Example 2 was carried out, except that 1,3-bis(3-aminophenoxy) benzene 8.76 g (0.03 moles) was used and the thickness of the adhesive layer was 10.0 μm, to produce a tripartite insulating tape 45 μm thick with a coefficient of thermal expansion of 19.8 ppm/° C.

EXAMPLE 4

The same procedure as in Example 1 was carried out, except that 1,3-bis(3-aminophenoxy) benzene 8.76 g (0.03 moles) was used, to produce a tripartite insulating tape 50 μm thick with a coefficient of thermal expansion of 23.5 ppm/° C.

COMPARATIVE EXAMPLE 1

The same procedure as in Example 2 was carried out, except that the thickness of the polyimide adhesive layer was 10 μm, to produce a tripartite insulating tape 45 μm thick with a coefficient of thermal expansion of 15.8 ppm/° C.

COMPARATIVE EXAMPLE 2

The same procedure as in Example 2 was carried out, except that the thickness of the polyimide adhesive layer was 7.5 μm, to produce a tripartite insulating tape 40 μm thick with a coefficient of thermal expansion of 15.4 ppm/° C.

COMPARATIVE EXAMPLE 3

The same procedure as in Example 3 was carried out, except that the thickness of the polyimide adhesive layer was 15.0 μm, to produce a tripartite insulating tape 55 μm with a coefficient of thermal expansion of 24 ppm/° C.

COMPARATIVE EXAMPLE 4

The same procedure as in Example 4 was carried out, except that the thickness of the polyimide adhesive layer was 17.5 μm, to produce a tripartite insulating tape 60 μm with a coefficient of thermal expansion of 24 ppm/° C.

The insulating tapes obtained in Examples and Comparative Examples were evaluated for reliability and the results are given in Table 1, below.

TABLE 1

| Exmp. # | Thermal Expansion Coeffi. (ppm/° C.) | # of Package Chip with Heel Crack | | | # of Package Chip with Heel Open | | |
|---|---|---|---|---|---|---|---|
| | | 300 Cycles | 600 Cycles | 1,000 Cycles | 300 cycles | 600 Cycles | 1,000 Cycles |
| 1 | 16.0 | 0/120 | 3/120 | 14/120 | 0/120 | 0/120 | 0/120 |
| 2 | 17.6 | 0/120 | 0/120 | 0/120 | 0/120 | 0/120 | 0/120 |
| 3 | 19.8 | 0/120 | 0/120 | 0/120 | 0/120 | 0/120 | 0/120 |
| 4 | 23.5 | 0/120 | 2/120 | 18/120 | 0/120 | 0/120 | 0/120 |
| C. 1 | 15.8 | 32/120 | 90/120 | 120/120 | 0/120 | 53/120 | 92/120 |
| C. 2 | 15.4 | 42/120 | 75/120 | 120/120 | 7/120 | 40/120 | 83/120 |
| C. 3 | 24.2 | 30/120 | 70/120 | 120/120 | 0/120 | 30/120 | 72/120 |
| C. 4 | 28.1 | 85/120 | 120/120 | 120/120 | 7/120 | 90/120 | 120/120 |

As apparent from the data of Table 1, the insulating tapes of the present invention are superior in reliability and thus very useful for LOC-type semiconductor chip packages.

The present invention has been described in an illustrative manner, and it is to be understood that the terminology used is intended to be in the nature of description rather than of limitation. Many modifications and variations of the present invention are possible in light of the above teachings. Therefore, it is to be understood that within the scope of the appended claims, the invention may be practiced otherwise than as specifically described.

We claim:

1. A semiconductor device comprising:

a lead-on-chip type semiconductor chip assembly having a copper lead frame and a semiconductor chip, said copper lead frame having no less than 98.5% copper; and an insulating tape interposed between said semiconductor chip and said lead frame, said insulating tape comprising:
a base film;
a first adhesive layer formed on one side of said base film; and
a second adhesive layer formed on an opposite side of said base film, said insulating tape having a coefficient of thermal expansion of between 16.0 to 23.5 ppm/° C.

2. The device of claim 1, wherein said base film is a polyimide film.

3. The device of claim 1, wherein each of said first and second adhesive layers has a coefficient of thermal expansion of 20–300 ppm/° C.

4. The device of claim 1, wherein each of said first and second adhesive layers is of a material selected from the group consisting of polyimide and polyamide-imide.

* * * * *